United States Patent
Nagata

(10) Patent No.: US 6,611,549 B1
(45) Date of Patent: Aug. 26, 2003

(54) FREQUENCY SWITCHING METHOD, VOLTAGE CONTROLLED OSCILLATOR USING SAME AND RECEIVER FOR SPREAD SPECTRUM COMMUNICATION USING SAME

(75) Inventor: Minoru Nagata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/320,693

(22) Filed: Jun. 8, 1999

(30) Foreign Application Priority Data

Sep. 22, 1998 (JP) ............................................ 10-268573

(51) Int. Cl.[7] .............................. H04B 1/69; G01S 5/04
(52) U.S. Cl. ........................................ 375/149; 342/442
(58) Field of Search ..................... 331/2, 1 A; 327/105, 327/156, 114; 341/116; 342/352; 375/147, 149, 150–153, 223

(56) References Cited

U.S. PATENT DOCUMENTS

| | | | | |
|---|---|---|---|---|
| 4,562,437 A | * | 12/1985 | Sasaki et al. ............... | 327/156 |
| 4,972,446 A | * | 11/1990 | Kennedy et al. ............ | 327/114 |
| 5,440,259 A | * | 8/1995 | Yokomura ................... | 327/156 |
| 5,834,987 A | * | 11/1998 | Dent ........................... | 327/105 |
| 5,903,593 A | * | 5/1999 | Ishiguro et al. ............. | 375/150 |

FOREIGN PATENT DOCUMENTS

| | | |
|---|---|---|
| JP | 10-276105 | 10/1998 |
| JP | 1-276946 | 11/1998 |

* cited by examiner

*Primary Examiner*—Stephen Chin
*Assistant Examiner*—Lawrence Williams
(74) *Attorney, Agent, or Firm*—Pillsbury Winthrop LLP

(57) ABSTRACT

A crystal oscillator which configures a voltage controlled oscillator having a variable oscillation frequency is also used as a crystal oscillator of an oscillator for generating a fixed frequency. Control input is integrated by an integrator, a phase of a frequency-divided signal obtained by dividing a fixed clock by a frequency divider is controlled by the integrated value to vary a frequency. Every time a phase-shifting amount at the time becomes to correspond to one clock, a frequency division ratio at dividing the clock is changed from a predetermined frequency division ratio for one time of frequency division to absorb the phase shifting amount for one clock, thereby operating as a voltage controlled oscillator. Thus, the voltage controlled oscillator having the frequency accuracy of a fixed clock is realized.

8 Claims, 9 Drawing Sheets

US 6,611,549 B1

FREQUENCY SWITCHING METHOD, VOLTAGE CONTROLLED OSCILLATOR USING SAME AND RECEIVER FOR SPREAD SPECTRUM COMMUNICATION USING SAME

BACKGROUND OF THE INVENTION

1. Field of the Invention

The invention relates to a frequency switching method and a voltage controlled oscillator using this method, and more particularly to a frequency switching method suitable for a voltage controlled oscillator for driving a spreading code generator by a reverse spread spectrum means in a receiver for spread spectrum communication and a voltage controlled oscillator using this method.

2. Description of the Related Art

FIG. 10 is a block diagram showing a receiver for spread spectrum communication by using a conventional voltage controlled oscillator. In the drawing, 101 denotes an antenna, 102 an amplifier, 103 a mixer, 104 an amplifier, 105 a reference signal source, 106 a crystal resonator for the reference signal source 105, 107 a reverse spread section, 108 a spreading code generator, 109 a voltage controlled oscillator for generating a clock to drive the spreading code generator 108, 110 a crystal resonator for the voltage controlled oscillator 109, 111 a phase error detector for detecting a phase error between a spreading code for spreading a reception signal and a spreading code generated by the spreading code generator 108, 112 a baseband processing section for the received signal, 113 a crystal resonator for generating a clock used in the baseband processing section, and 114 an output terminal. A reverse-spread section 120 for making reverse spread spectrum of the received signal comprises the reverse spread section 107, the spreading code generator 108, the voltage controlled oscillator 109, and the phase error detector 111.

The signal received by the antenna 101 is converted its frequency by the mixer 103 so as to have a frequency band lower than that of the received signal, subjected to the reverse spread spectrum by the reverse-spread section 120, undergone a predetermined processing by the baseband processing section 112 and output to the output terminal 114.

The receiver for spread spectrum communication by using the conventional voltage controlled oscillator 109 shown in FIG. 10 uses the three crystal resonators 106, 110, 113. Even if a circuit is integrated, these crystal oscillators remain as external parts for the integrated circuit. Therefore, in order to make the receiver small and inexpensive, it is necessary to use a plurality of crystal oscillators in common and decrease the necessary number of crystal oscillators.

However, in the receiver for spread spectrum communication using the voltage controlled oscillator 109, the voltage controlled oscillator 109 for generating a drive clock of the spreading code generator 108 must have a variable oscillation frequency and cannot be commonly used for the crystal resonator 106 for the reference signal source 105 and the crystal resonator 113 for generating a clock used by the baseband processing section which need a reference signal having a fixed frequency. Therefore, it is disadvantageous that the crystal resonator 106 and the crystal resonator 113 need to be provided separately.

SUMMARY OF THE INVENTION

It is an object of the invention to use a crystal oscillator which configures a voltage controlled oscillator having a variable oscillation frequency also as a crystal oscillator of an oscillator for generating a fixed frequency to decrease a necessary number of crystal oscillators, thereby making a receiver compact and inexpensive.

To achieve the above object of the invention, control input is integrated, when it is detected that the integrated value exceeds a predetermined range, a frequency division ratio used to divide the frequency of a reference signal is changed by one cycle, and the integrated value is reset to a predetermined initial value. Thus, based on a fixed reference signal, a frequency divided output having a frequency variable by the control input is obtained.

Thus, when the divided output is used as the voltage controlled oscillator of the receiver for spread spectrum communication, a crystal oscillator for the voltage controlled oscillator which generates a drive clock for a spreading code generator can be also used as a crystal oscillator for a reference signal source to be a reference signal having a fixed frequency and a crystal oscillator for generating a clock used in a baseband processing section. Accordingly, a required number of crystal oscillators can be decreased, and the receiver can be made compact and inexpensive.

DESCRIPTION OF THE PREFERRED EMBODIMENTS

Embodiments of the invention will be described in detail with reference to the accompanying drawings.

Figure 1:
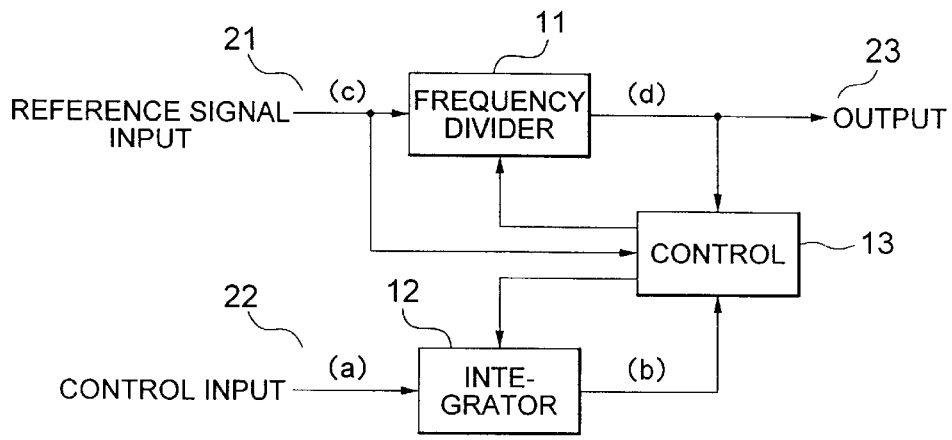
FIG. 1 is a block diagram for illustrating a first embodiment according to the invention.

FIG. 1 is a block diagram for illustrating a first embodiment of a voltage controlled oscillator according to the invention. In FIG. 1, 11 is a frequency divider, 12 is an integrator, 13 is a control for setting a frequency division ratio of the frequency divider 11 and an initial value of the integrator 12, 21 is an input terminal for supplying a reference signal, 22 is a control terminal for supplying a control signal, and 23 is an output terminal.

Figure 2:
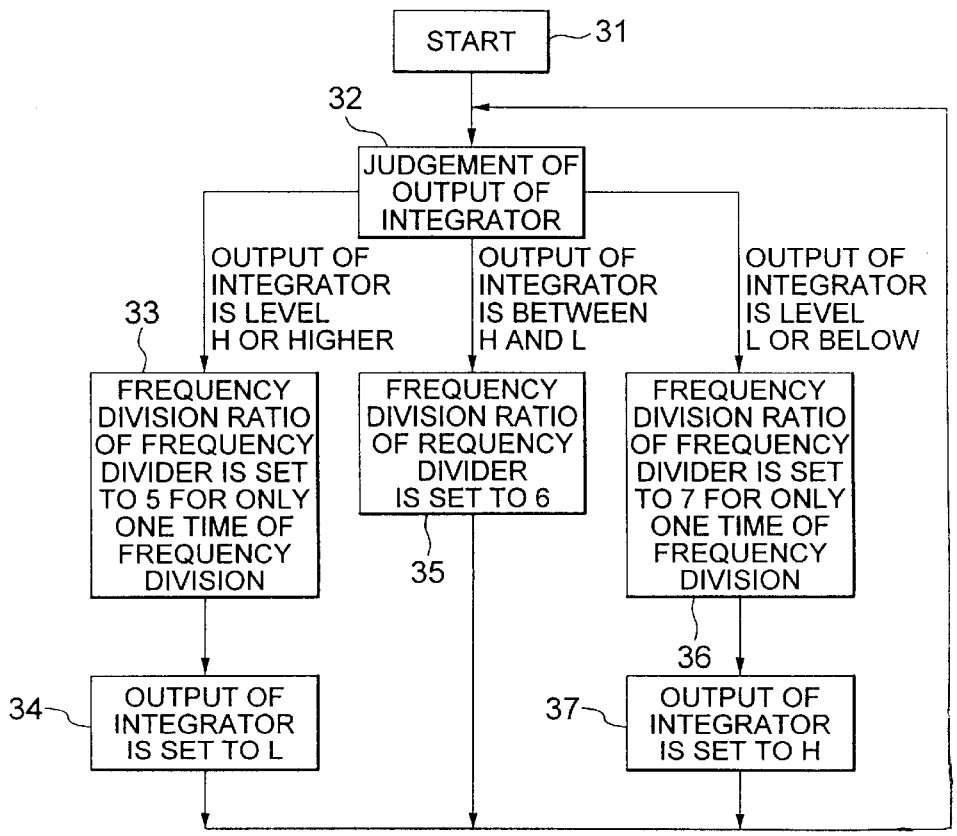
FIG. 2 is a flowchart for illustrating the operation of FIG. 1.

FIG. 2 is a flowchart for illustrating the operation of the control 13. Specifically, the control 13 compares output of the integrator 12 for two given levels H and L as indicated by a judgment made on output of the integrator 12 in section 32. It is judged whether the output of the integrator 12 is level H or higher, between levels H and L or level L or below. When the output is level H or higher, a frequency division ratio of the frequency divider 11 is set to 5 for only one time of frequency dividing operation as shown in section 33, and the output of the integrator 12 is set to fall in level L as indicated in section 34. When the output is between levels H and L, the frequency division ratio of the frequency divider 11 is remained at 6 as indicated in section 35, and when the output is level L or below, the frequency division ratio of the frequency divider 11 is set to 7 for only one time of frequency dividing operation as indicated in section 36 and also the output of the integrator 12 is set to fall in level H as indicated in section 37.

Figure 3:
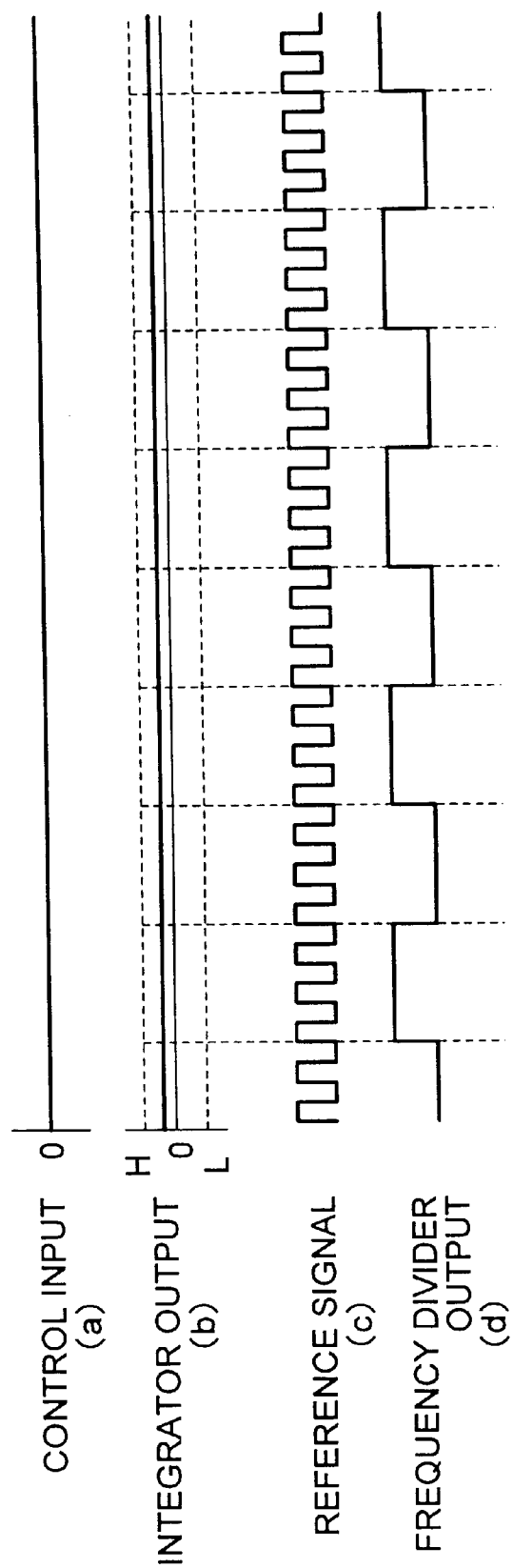
FIG. 3 is a diagram of signal waveforms for illustrating the operation of FIG. 1.
Figure 4:
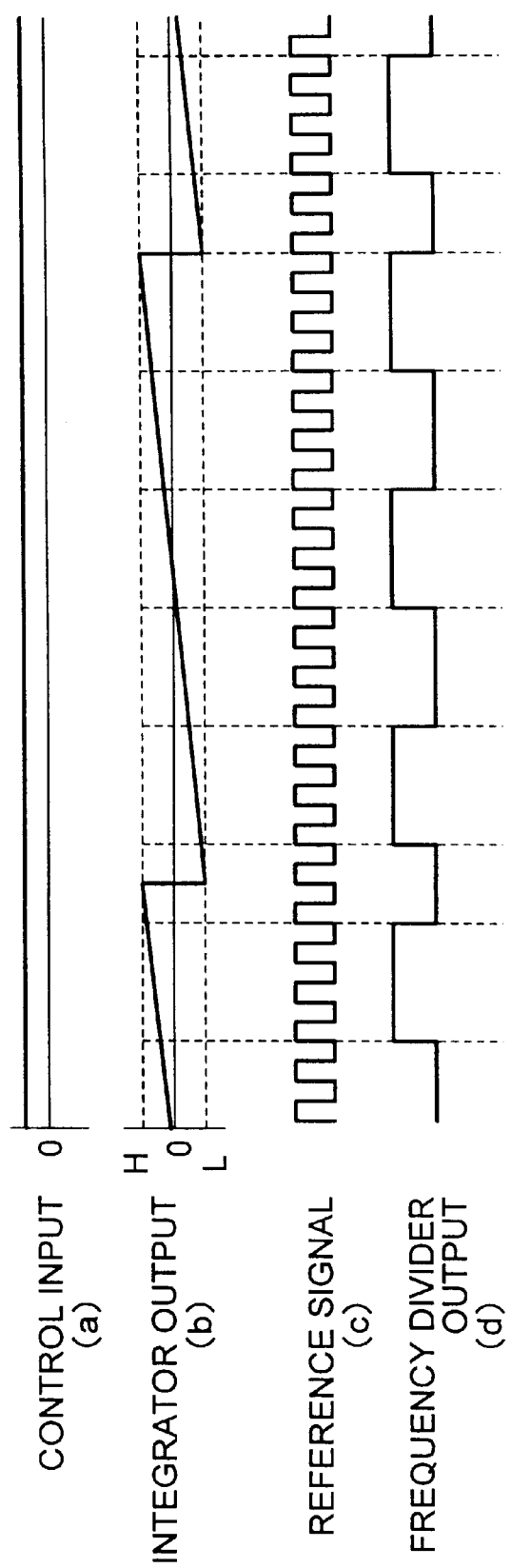
FIG. 4 is a diagram of signal waveforms for illustrating the operation of FIG. 1.
Figure 5:
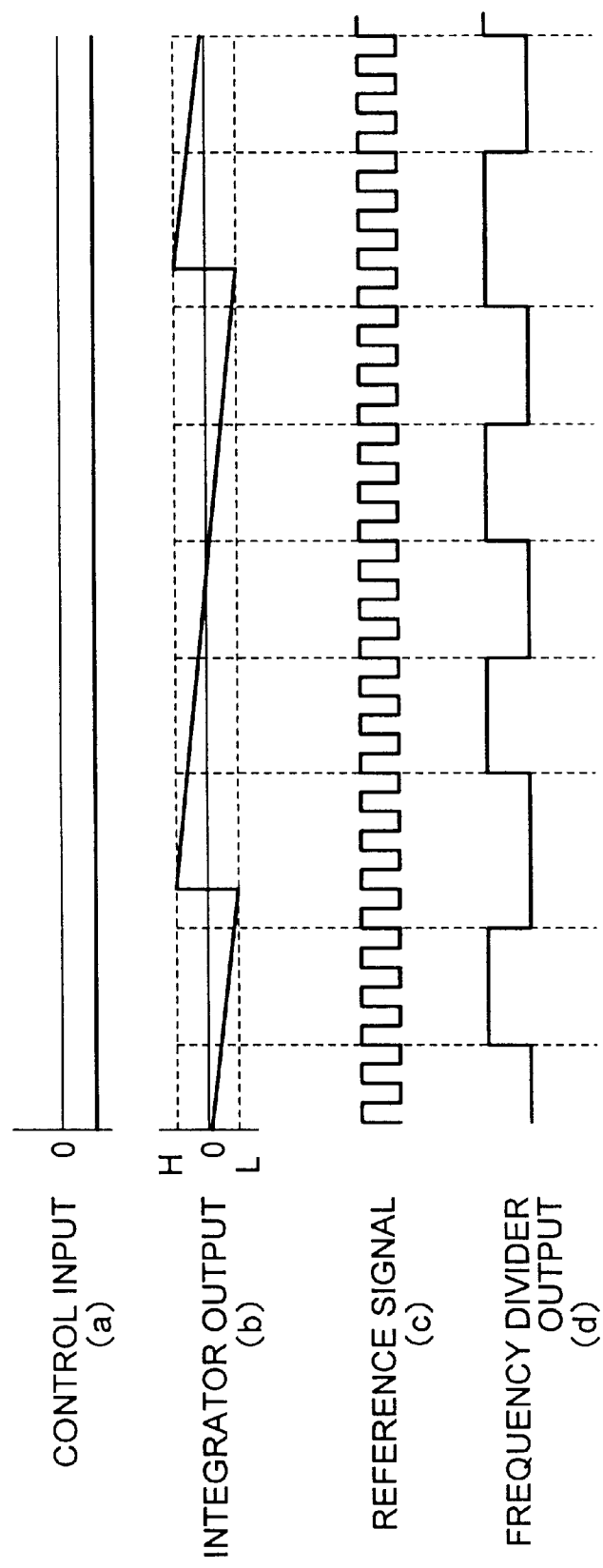
FIG. 5 is a diagram of signal waveforms for illustrating the operation of FIG. 1.

Referring to FIG. 3 through FIG. 5 showing diagrams of signal waveforms, the first embodiment according to the invention shown in FIG. 1 will be described. FIG. 3 through FIG. 5 show the diagrams of signal waveforms of the respective sections in FIG. 1 when the frequency division ratio of the frequency divider 11 is normally 6 and set to 5 or 7 for a single cycle by the control 13.

The first embodiment of the voltage controlled oscillator according to the invention shown in FIG. 1 will be described with reference to FIG. 3. When the control signal supplied to the control terminal 22 of FIG. 1 is zero as shown in FIG. 3(a), output of the integrator 12 remains fixed to a given value as shown in FIG. 3(b). Output of the frequency divider 11 is simply 6 frequency division of the reference signal as shown in FIG. 3(d) because the control 13 fixes the frequency division ratio of the frequency divider 11 at 6 normally.

When it is assumed that control input results in a positive value as shown in FIG. 4(a), the output of the integrator 12 increases with time as shown in FIG. 4(b). The control 13 detects that the output of the integrator 12 reaches a given level indicated by H in FIG. 4(b) and controls the frequency division ratio of the frequency divider 11 to 5 for one time of a primary frequency division and sets the output of the integrator 12 to a value indicated by L as shown in FIG. 4(b).

By operating as described above, the output of the integrator 12 changes in the shape of saw blades between L and H with time as shown in FIG. 4(b). The frequency divider 11 is normally set to 6 frequency division but set to 5 frequency division for only one time of frequency division every time the output of the integrator 12 changes from H to L, and the phase of the output from the output terminal 23 is advanced by only one cycle of the reference signal. This means that the output from the output terminal 23 has a high frequency on the basis of a signal which has the reference signal fixedly conducted 6 frequency division. Thus, when the control input is a positive value, the output has a high frequency.

When it is assumed that the control input is a negative value as shown in FIG. 5(a), the output of the integrator 12 lowers with time as shown in FIG. 5(b). The control 13 detects that the output of the integrator 12 reaches a given level indicated by L in FIG. 5(b) and controls to make the frequency division ratio of the frequency divider 11 to 7 for only one time of a primary frequency division and also sets the output of the integrator 12 to a value indicated by H in FIG. 5(b).

By operating as described above, the output of the integrator 12 changes between L and H shown in FIG. 5(b) with time in the shape of saw blades inverted from the one shown in FIG. 4, and the frequency divider 11, which is generally set to 6, becomes 7 for only one time of frequency division every time the output of the integrator 11 changes from L to H. Thus, the phase of the output from the output terminal 23 delays by only one cycle of the reference signal. This means that the output from the output terminal 23 has a low frequency on the basis of the signal which has the reference signal fixedly conducted 6 frequency division. When the control input is a negative value, the output has a low frequency.

As described above, in the voltage controlled oscillator according to the invention as shown in FIG. 1, a frequency having the reference input divided at a fixed frequency division ratio is determined as a center frequency to realize the voltage controlled oscillator of which output frequency is varied by the control input. This reference signal may have a fixed frequency, so that it can be the signal of another fixed frequency oscillator. Therefore, even when the center frequency is required to have the same accuracy of that of the crystal oscillator, it is not necessary to provide a crystal oscillator designed specifically for this voltage controlled oscillator.

Figure 6:
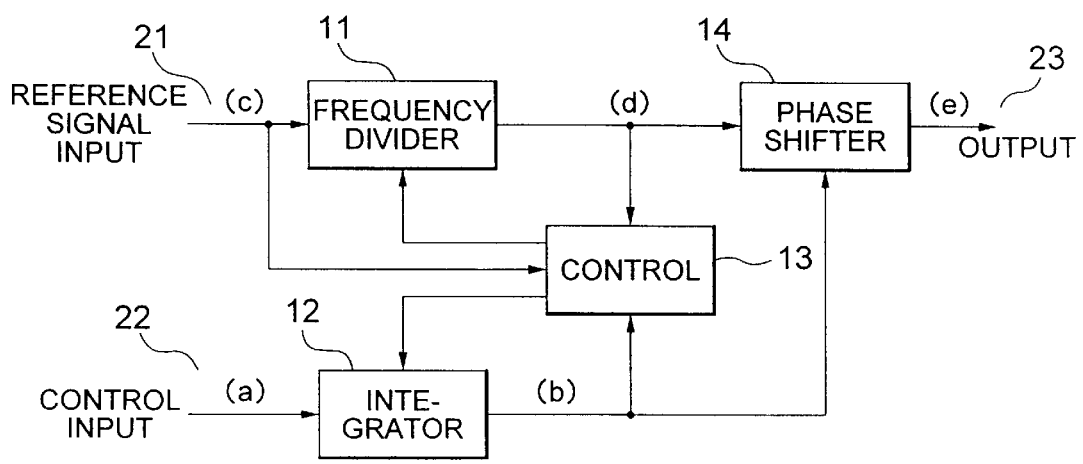
FIG. 6 is a block diagram for illustrating a second embodiment according to the invention.

FIG. 6 is a block diagram for illustrating a second embodiment of the invention. The same reference numerals as those in FIG. 1 are used to indicate the portions having the same functions. In this embodiment, a phase shifter is provided at the output of the voltage controlled oscillator of FIG. 1 so as to continuously change the phase. Specifically, the output of the frequency divider 11, which is the output of the voltage controlled oscillator of FIG. 1, is supplied to the phase shifter 14, and the output of the phase shifter 14 is lead to the output terminal 23. Based on the output of the integrator 12, the phase shifter 14 is controlled.

Figure 7:
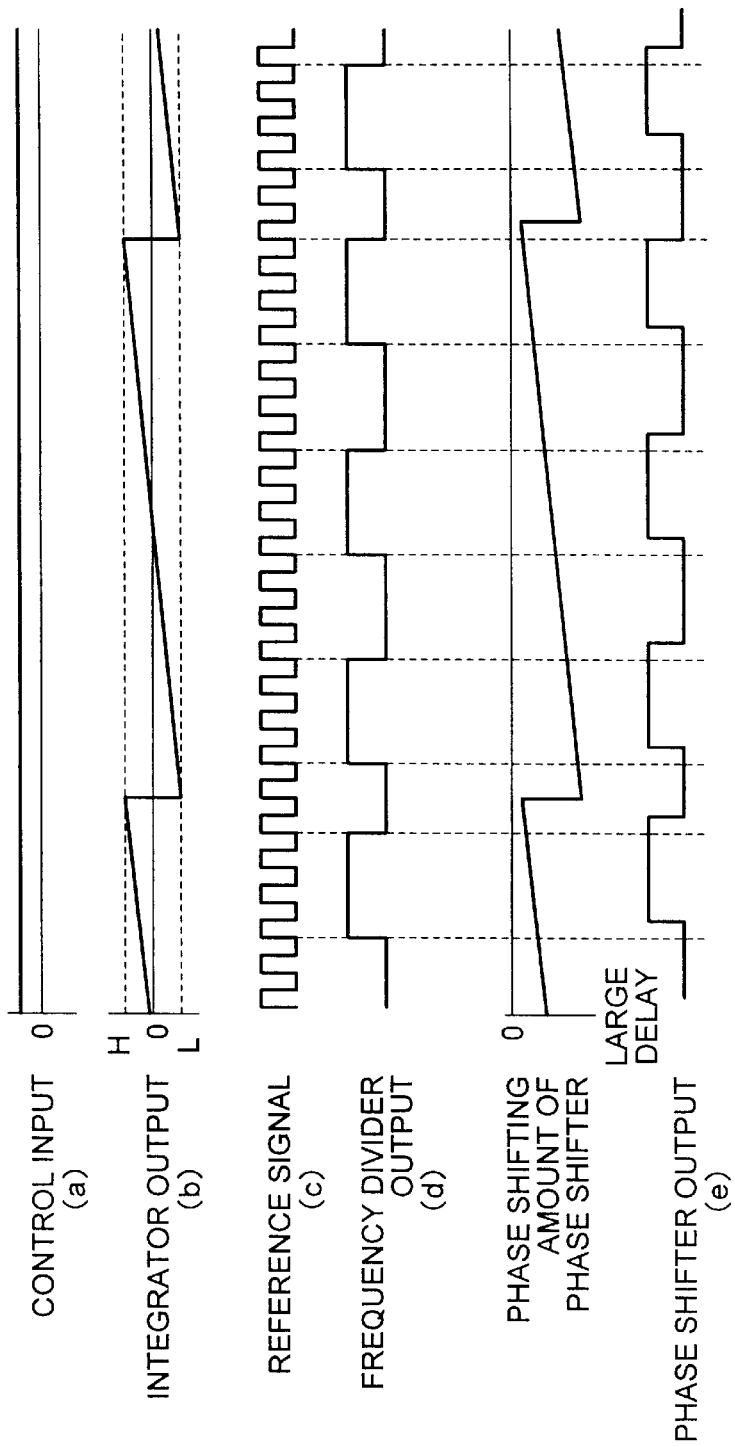
FIG. 7 is a diagram of signal waveforms for illustrating the operation of FIG. 6.

FIG. 7 shows diagrams of signal waveforms of the respective portions when the frequency division ratio of the frequency divider 11 of FIG. 6, which is normally 6, is set to be 5 or 7 for only one certain cycle by the control 13.

Portion (d) of FIG. 6 becomes output of the voltage controlled oscillator in the same way as in the embodiment according to the invention shown in FIG. 1. The output of the voltage controlled oscillator is passed through the phase shifter 14, and its phase-shifting amount is controlled by the output of the integrator 12, so that a change in phase of the output with respect to the output of the integrator 12 can be made continuously.

It is assumed that the control input is a positive value as shown in FIG. 7(a). Then, the output of the integrator 12 rises with time as shown in FIG. 7(b). The control 13 detects that the output of the integrator 12 reaches a predetermined level indicated by H in FIG. 7(b), controls to make the frequency division ratio of the frequency divider 11 5 for only one time of a primary frequency division, and sets the output of the integrator 12 to a value indicated by L in FIG. 7(b).

By operating as described above, the output of the integrator 12 changes in a saw blade shape with time between L and H of FIG. 7(b). The frequency divider 11, which normally conducts 6 frequency division, becomes to conduct 5 frequency division for only one time of frequency division every time the output of the integrator 12 changes from H to L, and the phase of the output from the output terminal 23 proceeds by only one cycle of the reference signal as shown in FIG. 7(d).

By setting the phase control sensitivity of the phase shifter 14 so that the change of the phase-shifting amount of the phase shifter 14 by the change of the output of the integrator 12 from H to L corresponds to one clock of the reference signal as shown in FIG. 7(e), an instantaneous phase change for one clock of the reference signal when the frequency division ratio of the frequency divider 11 becomes 5 for only one time of frequency dividing operation can be substantially absorbed by a change in phase-shifting amount for one clock of the reference signal of the phase shifter 14 to obtain the output as shown in FIG. 7(f).

FIG. 7 illustrates that a frequency rises. But, it is to be understood that the same operation can also be adopted when a frequency lowers, and an instantaneous phase change for one clock of the reference signal can also be absorbed substantially by the change of a phase-shifting amount for one clock of the reference signal of the phase shifter 14.

In this embodiment, a frequency having the reference input divided at a fixed frequency division ratio is determined as a center frequency, so that an output frequency is changed by the control input, and a voltage controlled oscillator of which phase is continuously variable can be realized. This reference signal may have a fixed frequency and can also be the signal of another fixed frequency oscillator, and even when this center frequency is required to have the same accuracy as the crystal oscillator, it is not necessary to provide a crystal oscillator designed particularly for this voltage controlled oscillator.

Figure 8:
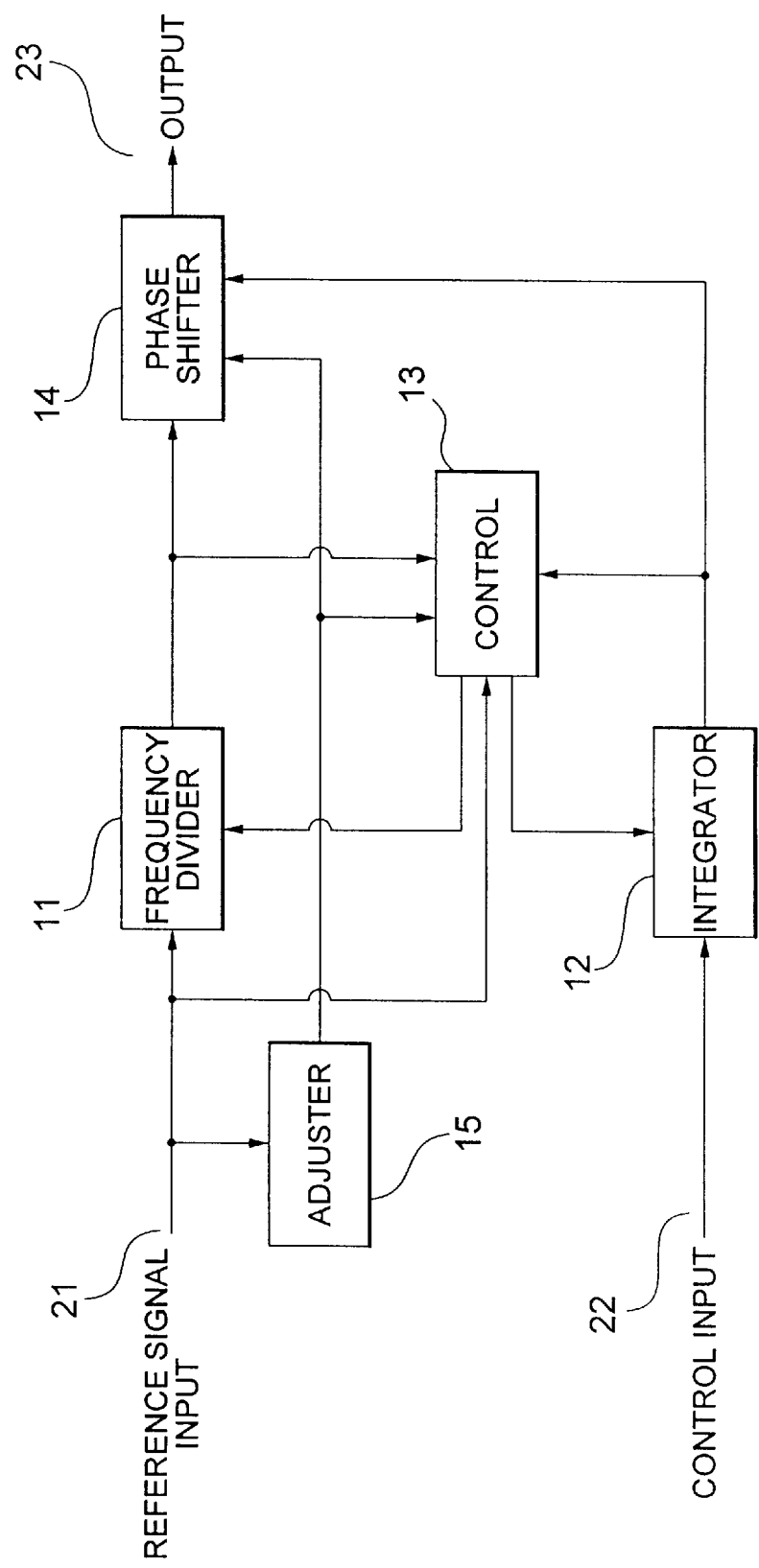
FIG. 8 is a block diagram for illustrating the second embodiment according to the invention.

FIG. 8 is a block diagram for illustrating a third embodiment of the invention. This embodiment is similar to the one shown in FIG. 6 except that a regulator 15 is added to control and set the control 13 and the phase shifter 14 based on the reference signal.

In this embodiment, even when the frequency of the reference signal is changed or the phase shifter 14 has variations in phase sensitivity, a voltage controlled oscillator, by which a change in the control input to the phase shifter 14 is corrected, a frequency which has the reference input divided at a fixed frequency division ratio is determined as a center frequency and an output frequency is varied by the control input, can be realized.

Figure 9:
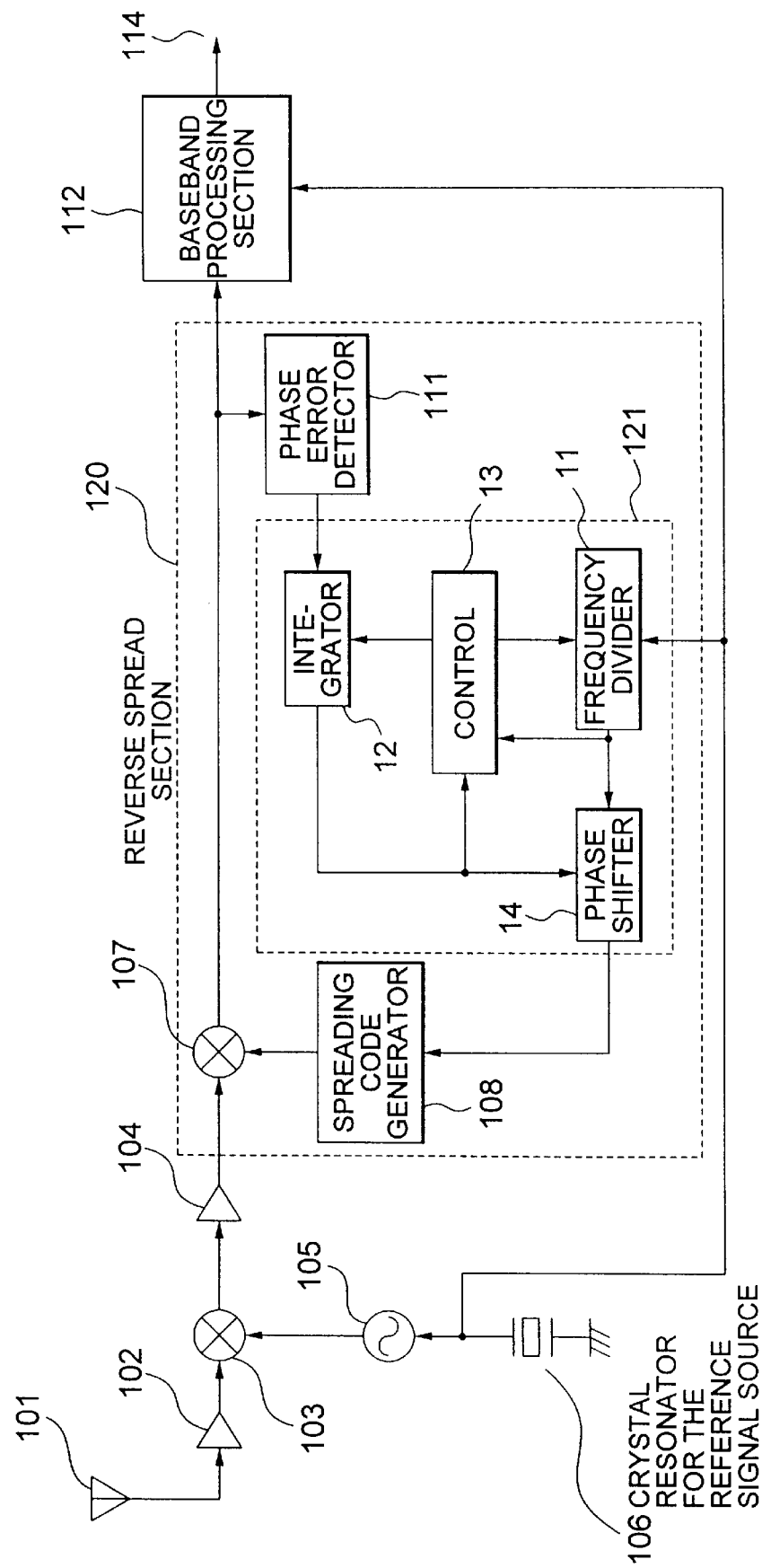
FIG. 9 is a block diagram for illustrating an embodiment in which the present invention is applied to a receiver for spread spectrum communication.
Figure 10:
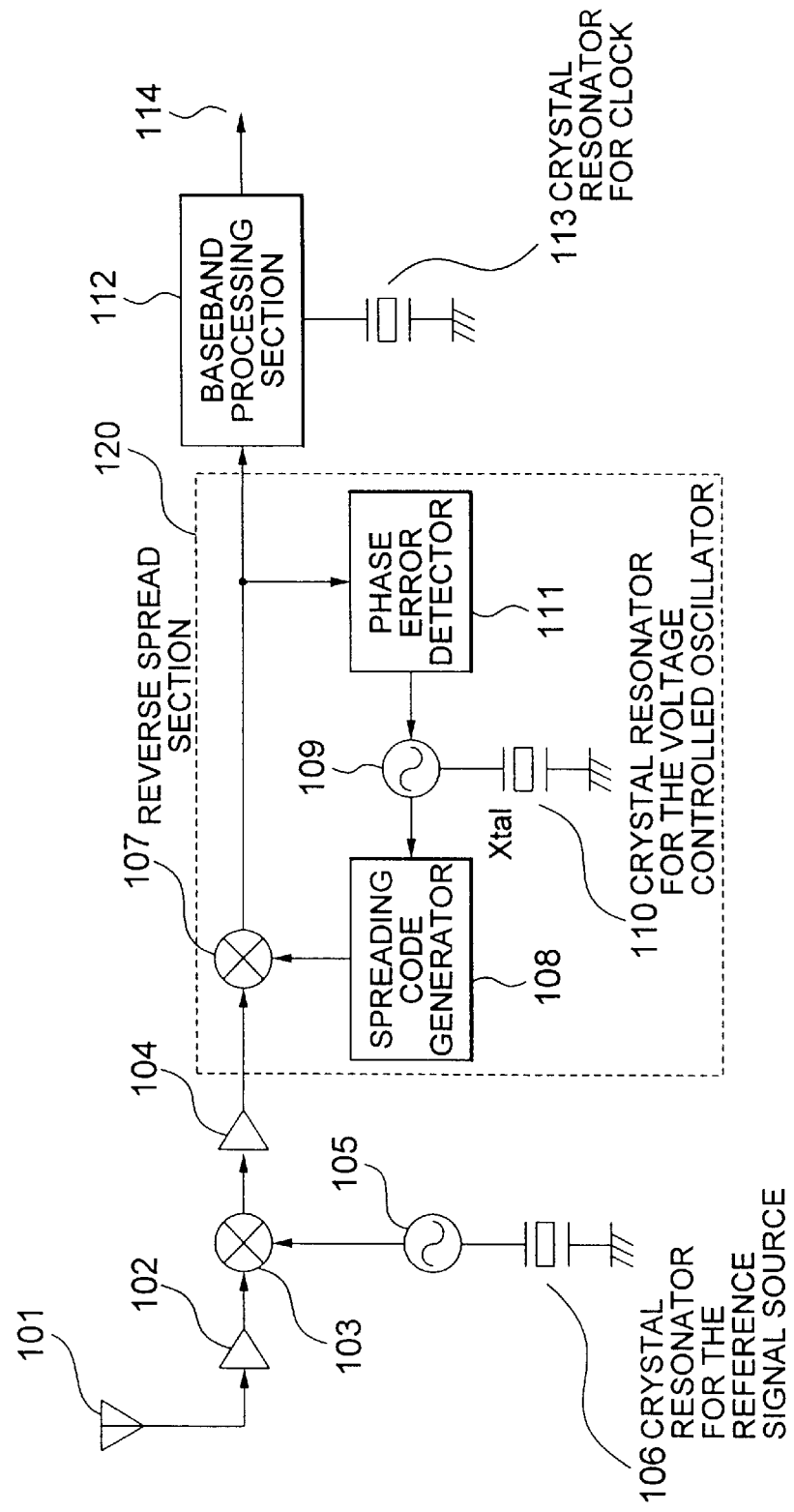
FIG. 10 is a block diagram for illustrating a conventional receiver for spread spectrum communication, which uses a voltage controlled oscillator.

FIG. 9 is a block diagram for illustrating a fourth embodiment according to the invention, in which a receiver for spread spectrum communication is configured by using the voltage controlled oscillator according to the invention. The same reference numerals as those used in the description of the conventional receiver for spread spectrum communication of FIG. 10 are used for the components having the same functions in the following description.

In FIG. 9, 101 is an antenna, 102 an amplifier, 103 a mixer, 104 an amplifier, 105 a reference signal source, 106 a crystal resonator for the reference signal source 105, 107 a reverse spread section, 108 a spreading code generator, 111 a phase error detector for detecting a phase error between a spreading code for spreading a reception signal and a spreading code generated by the spreading code generator, 112 a baseband processing section for the received signal, and 114 an output terminal. A reverse spread section 120 for performing reverse spread spectrum of the received signal comprises the reverse spread section 107, the spreading code generator 108, the phase error detector 111, and a voltage controlled oscillator 121 according to the invention.

The signal received by the antenna 101 is converted its frequency by the mixer 103 so as to fall in a frequency band lower than that of the received signal, subjected to the reverse spread spectrum by the reverse spread section 120, undergone a predetermined processing by the baseband processing section 112 and output from the output terminal 114. As the voltage controlled oscillator in the reverse spread section 120, the voltage controlled oscillator 121 according to the invention is used, so that the one crystal oscillator 108 can be used also for the voltage controlled oscillator 121 of the reverse spread section 120 and a clock generator of the baseband processing section.

As described above, the receiver for spread spectrum communication using the voltage controlled oscillator according to the invention can use a crystal oscillator for the voltage controlled oscillator for generating a drive clock of the spreading code generator also for the crystal oscillator of the reference signal source to be a reference signal with a fixed frequency and a crystal oscillator for generating a clock used in the baseband processing section. Thus, the required number of crystal oscillators is decreased, and the receiver can be made compact and inexpensive.

What is claimed is:

1. A frequency switching method, comprising the steps of:
 dividing a frequency of a reference signal at a given frequency division ratio;
 detecting whether an integrated value obtained by a control input signal with time exceeds a predetermined range;
 changing the frequency division ratio for frequency division of the reference signal by only one time when it is detected that the integrated value has exceeded the predetermined range;
 resetting the integrated value to a predetermined initial value; and
 shifting a phase of the divided reference signal with a predetermined amount according to an alteration of the integrated value so that the phase of the divided reference signal is changed continuously.

2. A voltage controlled oscillator, comprising:
 a frequency divider, which divides a reference signal at a given frequency division ratio and outputs a divided value;
 an integrator, which integrates a control input signal with time to output an integrated value and determines the integrated value;
 control means, which controls the frequency divider to determine the frequency division ratio of the frequency divider for only one time of the frequency dividing operation according to the integrated value, and controls the integrator to reset the integrated value to a predetermined initial value according to a direction in which the integrated value exceeds a predetermined range;
 a phase shifter, which shifts a phase of the divided value with a predetermined amount of shift according to an alternation of the integrated value so that the phase of the divided value is changed continuously.

3. The voltage controlled oscillator according to claim 2, wherein the control means controls the integrator to set a higher value by a predetermined amount than a lower limit of the predetermined range when the integrated value exceeds the upper limit of the predetermined range, and controls the integrator to set a lower value by a predetermined amount than an upper limit of the predetermined range when the integrated value exceeds the lower limit of the predetermined range.

4. In the frequency switching method according to claim 2, further comprising:
 adjusting means, which adjusts to match a phase-shifting amount of the divided value when the control means controls the frequency divider to determine the frequency division ratio for only one time of the frequency dividing operation with a shifted amount of the phase-shifting amount of the phase shifter due to an alteration of the integrated value.

5. A voltage controlled oscillator, comprising:

a frequency divider, into which a reference signal is input, and which performs frequency division of the reference signal at a given frequency division ratio determined by frequency dividing control and outputs a divided value;

an integrator, which integrates control input with time to output an integrated value and determines the output value to a given value by integrating control; and control means, which comprises a comparator for comparing the output of the integrator with a reference level, and when output of the integrator exceeds a predetermined range, controls a frequency division ratio of the frequency divider to change a predetermined frequency division ratio for only the frequency dividing operation of the next one cycle of frequency dividing operation according to a direction in which the output of the integrator exceeds the predetermined range and also performs integrating control so as to set the output of the integrator to a predetermined value according to the direction in which the output of the integrator exceeds the predetermined range; and adjusting means, which adjusts the reference level so as to match a phase-shifting amount of the output of the frequency divider when the frequency dividing control is made to change the frequency division ratio for only the frequency dividing operation of one cycle on the basis of the reference signal by the control means with a changed amount of the phase-shifting amount of the phase shifter due to a change in output of the integrator when the integration control is performed to determine to a predetermined value according to the direction in which the output of the integrator exceeds the predetermined range.

6. A voltage controlled oscillator, comprising:

a frequency divider, into which a reference signal is input, and which performs frequency division of the reference signal at a given frequency division ratio determined by frequency dividing control and outputs a divided value;

an integrator, which integrates control input with time to output an integrated value and determines the output value to a given value by integrating control; and control means, which comprises a comparator for comparing the output of the integrator with a reference level, and when output of the integrator exceeds a predetermined range, controls a frequency division ratio of the frequency divider to change a predetermined frequency division ratio for only the frequency dividing operation of the next one cycle of frequency dividing operation according to a direction in which the output of the integrator exceeds the predetermined range and also performs integrating control so as to set the output of the integrator to a predetermined value according to the direction in which the output of the integrator exceeds the predetermined range; and adjusting means, which adjusts the changed amount of the phase shifting amount of the phase shifter due to the output change of the integrator so as to match a phase-shifting amount of the output of the frequency divider when the frequency dividing control is made to change the frequency division ratio for only the frequency dividing operation of one cycle on the basis of the reference signal by the control means with a changed amount of the phase-shifting amount of the phase shifter due to a change in output of the integrator when the integration control is performed to determine to a predetermined value according to the direction in which the output of the integrator exceeds the predetermined range.

7. A receiver for spread spectrum communication, comprising:

spreading code generating means, which receives a signal which is spectrum spread by a transmission side and generates from the received signal the same spreading code as the one used for the spread spectrum by the transmission side;

phase error detecting means, which detects a phase difference between a phase of the spreading code generated by the receiver and a phase of the spreading code for spreading the received signal; and control means, which determines the output of the phase error detecting means as control input of a voltage controlled generator, controls a generating speed of the spread signal of the spreading code generating means by the output of the voltage controlled generator, and controls to match a phase of the spread signal generated by the receiver with a phase of the spread signal for spreading the received signal, wherein the voltage controlled generator comprises a frequency divider, into which a reference signal is input, and which performs frequency division of the reference signal at a predetermined frequency division ratio determined by the frequency dividing control and outputs a divided value;

an integrator, which integrates the phase difference detected by the phase error detecting means with time to output an integrated value and determines the output value to a predetermined value by integration control; and integration control means, which when output of the integrator exceeds a predetermined range, controls, according to a direction in which the output of the integrator has exceeded the predetermined range, a frequency division ratio of the frequency divider to change a predetermined frequency division ratio for only the frequency dividing operation of the next one cycle so as to set the output of the integrator to a predetermined value according to the direction in which the output of the integrator has exceeded the predetermined range.

8. The receiver for spread spectrum communication according to claim 7, wherein a phase shifter is disposed between the output of the voltage controlled generator and the spreading code generating means.

* * * * *